(12) United States Patent
Proto et al.

(10) Patent No.: US 9,187,584 B2
(45) Date of Patent: Nov. 17, 2015

(54) IMIDIZED POLYMERS CONTAINING LUMINESCENT GROUPS AND METHOD FOR OBTAINING THEM

(75) Inventors: Antonio Alfonso Proto, Novara (IT); Roberto Fusco, Novara (IT); Mario Salvalaggio, Moriondo Torinese (IT); Giacomo Ottimofiore, Senago (IT)

(73) Assignee: ENI S.p.A., Rome (IT)

( * ) Notice: Subject to any disclaimer, the term of this patent is extended or adjusted under 35 U.S.C. 154(b) by 247 days.

(21) Appl. No.: 13/140,636

(22) PCT Filed: Dec. 17, 2009

(86) PCT No.: PCT/EP2009/009111
§ 371 (c)(1),
(2), (4) Date: Aug. 18, 2011

(87) PCT Pub. No.: WO2010/078933
PCT Pub. Date: Jul. 15, 2010

(65) Prior Publication Data
US 2011/0301301 A1 Dec. 8, 2011

(30) Foreign Application Priority Data

Dec. 19, 2008 (IT) .............................. MI2008A2276

(51) Int. Cl.
| | | |
|---|---|---|
| *H01L 31/055* | (2014.01) | |
| *C08F 8/32* | (2006.01) | |
| *C08F 8/48* | (2006.01) | |
| *C09K 11/06* | (2006.01) | |
| *C08F 8/30* | (2006.01) | |
| *H01L 31/0216* | (2014.01) | |

(52) U.S. Cl.
CPC ... *C08F 8/30* (2013.01); *C08F 8/32* (2013.01); *C08F 8/48* (2013.01); *C09K 11/06* (2013.01); *H01L 31/02167* (2013.01); *H01L 31/02168* (2013.01); *H01L 31/055* (2013.01); *C09K 2211/14* (2013.01); *C09K 2211/145* (2013.01); *C09K 2211/1416* (2013.01); *C09K 2211/1466* (2013.01); *Y02E 10/52* (2013.01)

(58) Field of Classification Search
CPC .................. H01L 31/02167; H01L 31/02168; H01L 31/055; C08F 8/30; C08F 8/32; C08F 8/48; C09K 11/06; C09K 2211/14; C09K 2211/1408; C09K 2211/1416; C09K 2211/1425; C09K 2211/145; C09K 2211/1466
USPC ............... 525/330.5, 374, 379; 257/432, 436, 257/E31.129
See application file for complete search history.

(56) References Cited

U.S. PATENT DOCUMENTS

| | | | |
|---|---|---|---|
| 4,968,755 A | | 11/1990 | Canova et al. |
| 5,013,774 A | * | 5/1991 | Nishida et al. .................. 524/91 |
| 5,021,514 A | | 6/1991 | Canova et al. |
| 5,294,680 A | | 3/1994 | Knors et al. |
| 5,378,765 A | * | 1/1995 | Besecke et al. ............ 525/330.5 |
| 6,077,911 A | * | 6/2000 | Besecke et al. ............ 525/329.9 |
| 6,184,305 B1 | * | 2/2001 | Kan et al. .................... 525/327.6 |
| 6,255,405 B1 | | 7/2001 | Kang et al. |
| 2008/0073754 A1 | | 3/2008 | Zampini et al. |

FOREIGN PATENT DOCUMENTS

| | | |
|---|---|---|
| EP | 0 549 922 | 7/1993 |
| EP | 0 583 205 | 2/1994 |
| EP | 0 861 855 | 9/1998 |
| EP | 0 982 320 | 3/2000 |
| EP | 1 906 249 | 4/2008 |
| JP | 63 114273 | 5/1988 |

OTHER PUBLICATIONS

Schwarz et al., Analytical Chemistry 48, 3 (1976) 524-528.*
Mannekutla et al., Spectrochimica Acta Part A 69 (2008) 419-426.*
Swartz et al., Analytical Chemistry 48 (1976) 524-528.*
Slooff, L. H. et al., "Efficiency Enhancement of Solar Cells by Application of a Polymer Coating Containing a Luminescent Dye", Journal of Solar Energy Engineering, vol. 129, No. 3, pp. 272-276, XP-009133509, (Aug. 2007).
International Search Report Issued May 21, 2010 in PCT/EP09/009111 filed Dec. 17, 2009.

* cited by examiner

*Primary Examiner* — Roberto Rabago
(74) *Attorney, Agent, or Firm* — Oblon, McClelland, Maier & Neustadt, L.L.P.

(57) ABSTRACT

The present invention relates to photoactive polymers and copolymers of acrylic monomers comprising cycloimide units functionalized with at least one luminescent chromophore group, preferably photoluminescent. The present invention also relates to spectrum converters comprising the above photoactive polymers and copolymers and solar devices comprising said converters.

10 Claims, No Drawings

IMIDIZED POLYMERS CONTAINING LUMINESCENT GROUPS AND METHOD FOR OBTAINING THEM

The present invention relates to imidized polymers containing luminescent groups and the method for obtaining them. In particular, the present invention relates to photoactive polymers and copolymers of acrylic monomers comprising imide groups functionalised with at least one luminescent chromophore group, preferably photoluminescent.

The present invention further relates to spectrum converters based on imidized polymers containing luminescent groups.

The present invention falls within the field of photoactive materials which can be used in the construction of devices for exploiting solar energy (hereafter called "solar devices"), such as for example, photovoltaic cells and photoelectrolytic cells.

In the state of the art, one of the main limits for exploiting solar radiation energy is represented by the capacity of solar devices of optimally and exclusively absorbing radiations having a wave-length which falls within a narrow spectral range.

Against a spectral range of solar radiation which extends from wave-lengths of about 300 nm to wavelengths of about 2,500 nm, solar cells based on crystalline silicon, for example, have an optimum absorption area (effective spectrum) within the range of 900-1,100 nm, whereas polymer solar cells are susceptible to damage if exposed to radiations having wave-lengths lower than about 500 nm, due to induced photodegradation phenomena which become significant below this limit.

In order to overcome these drawbacks, devices have been developed which, when interposed between the light radiation source (the sun) and the solar device, selectively absorb incident radiations having wave-lengths outside the effective spectrum of the device, re-emitting the energy absorbed in the form of photons having a wave-length within the effective spectrum. These devices are called "spectrum converters" or "luminescent concentrators". When the energy of the photons re-emitted from the converter is higher than that of the incident photons, the photoluminescence process, comprising the absorption of the solar radiation and subsequent re-emission of photons having a lower wavelength, is also called "up-conversion" process. When, on the contrary, the energy of the photons emitted from the converter is lower than that of the incident photons, the photoluminescence process is defined "down-conversion" process.

Spectrum converters known in the state of the art typically consist of a support made of a material transparent to solar radiations having frequencies which fall within the effective spectrum frequency range of the solar device, containing luminescent chromophore groups consisting of organic molecules or metallic complexes (for example, polymeric or inorganic glass).

The chromophore groups can be deposited on the glass support in the form of a thin film or, as in the case of polymeric materials, they can be dispersed inside the polymeric matrix. It is possible for different chromophore groups (with absorption and/or emission in different bands) to be combined with each other in order to intercept a wider radiation spectrum, either by distributing various layers having different compositions, or by dispersing various chromophores in the polymer mass.

The preparation of spectrum converters by dispersion of the chromophore species inside the polymeric matrix has various disadvantages. In particular, this technique does not guarantee a homogeneous dispersion of the chromophore species in the polymeric matrix. Furthermore, the dispersed chromophore species are also subject to segregation or diffusion phenomena inside the polymeric matrix with a consequent reduction in the efficacy of the spectrum converter.

Various imidization processes in a polymer melt have been known in the art for some time. These processes are based on imidization reactions of polymers carried out at a temperature higher than their melting point using reagents based on amines, amides or compounds capable of generating these species (see for example the documents U.S. Pat. No. 4,968, 755, IT 1224419 and IT 1227704). Imidization processes are used for improving the physico-chemical properties of polymers, in particular for increasing their glass transition temperature. The use of imidization processes for the preparation of photo-active polymeric materials, on the other hand, is not known.

An objective of the present invention is to overcome the drawbacks described of the known art.

A first object of the present invention relates to a spectrum converter comprising photo-active polymers and copolymers of acrylic monomers comprising cycloimide units functionalised with at least one luminescent chromophore group, preferably photoluminescent.

For the purposes of the present invention, acrylic monomers refer to monomeric compounds such as, for example, acrylic and methacrylic acids, the relative esters of the type methyl methacrylate, ethyl methacrylate, tert-butyl methacrylate, methyl-, ethyl-, butyl-, isopropyl acrylate, amides such as acryl- and methacryl-amides, etc.

Suitable polymers and copolymers according to the present invention are, for example, polymers and copolymers of the above acrylic monomers, preferably polymers and copolymers of methyl acrylate, methyl methacrylate and butyl methacrylate, or copolymers of said monomers with vinyl aromatic monomers, preferably styrene, either of the statistical or block type. The polymers and copolymers comprise the above modified cycloimide units in the main chain.

Polymers and copolymers of the present invention comprising, in the main chain, the following cycloimide unit functionalised with at least one luminescent chromophore group having general formula (I) are preferred:

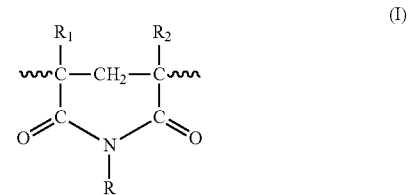

wherein $R_1$ and $R_2$ are H or hydrocarbon groups, preferably aliphatic, having from 1 to 8 carbon atoms, and more preferably they are both methyl, and R is a luminescent chromophore group, preferably photoluminescent.

The cycloimide unit functionalised with at least one luminescent chromophore group having general formula (I) has a structure ascribable to that of substituted glutarimide.

For the purposes of the present invention luminescent chromophore group means a group having luminescent, in particular photoluminescent, properties, i.e. a group capable of absorbing electromagnetic radiation having a wave-length within a certain spectral region and re-emitting the energy absorbed in the form of radiations having a wave-length within a different spectral region.

The radiative emission process can indifferently take place according to any radiative de-excitation mechanism (fluorescence, resonance fluorescence, delayed fluorescence, phosphorescence, etc.) and can be associated with other photophysical phenomena (formation of excimers, energy transfer, etc.).

Particularly preferred among the polymers and copolymers suitable for the present invention, are polymers and copolymers comprising, in the main chain, from 0.10 to 99.99% in moles of monomeric units of an alkylacrylate or alkylmethacrylate, from 69.99 to 0% in moles of a vinyl aromatic monomer and from 0.01 to 5%, preferably from 0.10 to 3% in moles of cycloimide units functionalised with at least one luminescent chromophore group, said functionalised cycloimide units preferably consisting of units having general formula (I), and from 0 to 99.89%, preferably from 1 to 90%, in moles of cycloimide units having a structure having general formula (Ib):

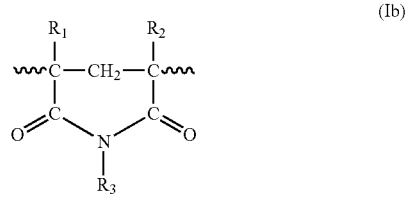

(Ib)

wherein the groups $R_1$ and $R_2$ have the meaning indicated above and the group $R_3$ consists of H or an aliphatic or aromatic hydrocarbon group having from 1 to 10 carbon atoms.

The above percentages in moles refer to the total moles of the monomeric units of the functionalised polymer or copolymer.

The structure having general formula (Ib), analogously to general formula (I), can be ascribed to glutarimide.

Alkylacrylates and alkylmethacrylates preferably refer to compounds having general formula (II)

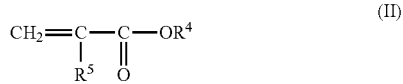

(II)

wherein:
$R^4$=alkyl or aryl containing from 1 to 20, preferably from 1 to 6 carbon atoms;
$R^5$=H or an alkyl having from 1 to 6, preferably 1, carbon atoms.

For the purposes of the present invention, vinyl aromatic monomers preferably refer to compounds in which at least one vinyl group is bound to an aromatic ring, particularly those included in the general formula (III):

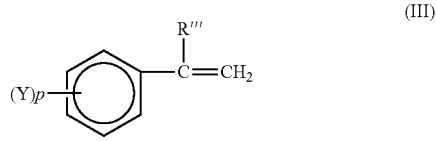

(III)

wherein R''' represents hydrogen or an alkyl radical having from 1 to 4 carbon atoms; p is zero or an integer ranging from 1 to 5, whereas Y represents a halogen or an alkyl radical having from 1 to 4 carbon atoms.

Examples of vinyl aromatic monomers having general formula (III) indicated above are: styrene, p-methylstyrene, p-tert-butylstyrene, ortho- and para-chlorostyrene, di-, tri-, tetra- and penta-chlorostyrenes, α-methylstyrene.

Particularly preferred among the polymers and copolymers, object of the present invention, are polymers and copolymers of methyl methacrylate, which have a high transparency to solar radiation and a characteristic refraction index.

The polymers and copolymers of the present invention are preferably selected from those having a high transparency at least in the spectral region useful for a good functioning of the photovoltaic cell coupled with the photoconverter. In particular, these preferred polymers and copolymers are transparent to the radiation emitted from the luminescent groups present on the functionalised cycloimide.

An expert in the field can conveniently select the type of luminescent chromophore and the polymer or copolymer among those previously indicated as object of the present invention, in order to obtain the imidized polymer or copolymer with the most suitable properties for the final application for which it is destined.

For the preparation of the photoactive polymers and copolymers of the present invention, it is preferable to use polymers and copolymers based on acrylic esters as starting molecules. Branched copolymers of acrylic monomers and possible vinyl aromatic monomers with small quantities of diacrylic monomers or divinyl aromatic monomers, such as divinyl benzene or 1,2-ethyl-eneglycoldimethacrylate, are equally suitable.

As already specified, for the purposes of the present invention, luminescent chromophore group refers to a group having luminescent properties, in particular photoluminescent, i.e. a group capable of absorbing electromagnetic radiation having a wave-length within a certain spectral region and re-emitting the energy absorbed in the form of radiations having a wave-length within a different spectral region.

Chromophore groups comprising a multiple-type system of π delocalised electrons are preferred, such as, for example, groups comprising aromatic hydrocarbons optionally polycondensed, preferably pyrene, anthracene, perylene, and derivatives thereof, in addition to compounds containing aromatic heterocycles. These groups can comprise substituents with a bathochromic or hypsochromic effect such as, for example, trifluoro-methyl, fluorine, cyano substituents.

Non-limiting examples of the chromophore groups present in the cycloimide units of the polymers or copolymers of the present invention, i.e. the R groups in general formula (I), comprise the structures schematically indicated in Table 1 below, and the substituted derivatives thereof:

TABLE 1

| R | Formula | $\lambda_{max}^{ex}$ (nm) | $\lambda_{max}^{em}$ (nm) |
|---|---|---|---|
| Anthracene | | 350-400 | 400-450 |
| Phenanthrene | | 330-380 | 380-440 |

TABLE 1-continued

| R | Formula | $\lambda_{max}^{ex}$ (nm) | $\lambda_{max}^{em}$ (nm) |
|---|---|---|---|
| Pyrene | | 335-350 | 350-400 |
| Perylene | | 440-470 | 470-500 |
| p-Ter-phenyl | | 275-300 | 340-380 |
| 1,6-Diphenyl-hexatriene n = 1-3 | | 350-400 | 450-500 |
| Quinoline | | 280-300 | 400-450 |
| Phenan-throline | | 250-280 | 370-400 |
| Coumarin | | 300-350 | 400-550 |

In Table 1, $\lambda_{max}^{ex}$ and $\lambda_{max}^{em}$ respectively indicate the wave-length ranges of the excitation band peak (absorption) and the emission band peak of each chromophore group, according to the type and position of the substituent or substituents on the skeleton.

The structure indicated in Table 1 can be bound to the imide nitrogen inserted in the cycloimide unit in any of the positions available in the molecular skeleton.

Equally included in the scope of the present invention are chromophore groups having one of the above molecular structures substituted in one or more points of the molecular skeleton with alkyl or aryl groups having from 1 to 15 carbon atoms, or other auxochrome substituents, with a hypsochromic or bathochromic effect, according to what is known in the art.

Typical examples of auxochrome groups are listed below:

| auxochrome | $\Delta\lambda_{max}^{ex}$ (nm) |
|---|---|
| —SR[4] | 30-45 |
| —NR[4]$_2$ | 40-60 |
| —OR[4] | 10-30 |
| —OAr | 40-60 |
| —COOH | 20-40 |
| —CN | 15-25 |
| —Cl | 3-8 |
| —R[4] | 4-6 | wherein R[4] independently represents H or an alkyl group having from 1 to 10 carbon atoms and Ar an aromatic or heteroaromatic group having from 5 to 10 carbon atoms; $\Delta\lambda_{max}^{ex}$ is the hypso- or bathochromic shift.

The chromophore groups with the least overlapping between the absorption band and emission band are potentially the most promising, as they are less subject to self-quenching phenomena. Preferred chromophore groups for use in a spectrum converter device according to the present invention, have a difference between $\lambda_{max}^{ex}$ and $\lambda_{max}^{em}$ of at least 50 nm, more preferably from 70 to 400 nm.

Specific non-limiting examples of compounds containing chromophore groups bonded to an amine group, suitable for the preparation for imidization of the polymers according to the present invention, are indicated in Table 2 below:

TABLE 2

| Chromophore | Formula | $\lambda_{max}^{ex}$ | $\lambda_{max}^{em}$ |
|---|---|---|---|
| 3-aminocoumarin | | 325 | 450 |
| 6-amino-3,4-benzocoumarin | | 350 | 470 |

TABLE 2-continued

| Chromophore | Formula | $\lambda_{max}^{ex}$ | $\lambda_{max}^{em}$ |
|---|---|---|---|
| 1-aminopyrene | | 350 | 400 |
| N-Salicidene-4-aminoaniline | | 380 | 580 |
| α-Benzoyl-4-aminocinnamonitrile | | 420 | 630 |
| 5-amino-1,8-(N-octyl)-naphthalimide | | 380 | 470 |
| 3-aminofluoranthene | | 380 | |

In Table 2, $\lambda_{max}^{ex}$ and $\lambda_{max}^{em}$ respectively indicate the peak wave-length of the excitation band (absorption) and emission band of each chromophore group.

Unlike the polymer spectrum converters known in the state of the art in which the chromophore species are dispersed in the polymeric matrix, in the photoactive polymers and copolymers according to the present invention, the chromophore groups are chemically bound to the polymeric chain. In particular, the chromophore groups are bound as substituent groups to an imide nitrogen atom inserted in a structure of the cycloimide type, preferably different from the maleimide structure, more preferably having the glutarimide ring structure.

The total concentration of the chromophore groups inside the polymer or copolymer varies from 0.01 to 10%, preferably from 0.01 to 5%, more preferably from 0.1 to 3%, in moles with respect to the total moles of the monomeric units of the functionalised polymer or copolymer.

In order to reduce the optical quenching (self-absorption) and obtain an optimum conversion efficiency, the quantity of chromophore group in the polymer is conveniently selected so that the concentration increases with an increase in the difference between the absorption λ and emission λ.

The imide nitrogen atoms which are not substituted by a chromophore group can be totally or partly substituted by hydrogen, alkyl groups and/or phenyl groups. As is known, the presence of imide groups N-substituted with H, groups of the alkyl or phenyl type, increase the stability of the polymers and copolymers containing them, in particular increasing their glass transition temperature (Tg).

The polymers and copolymers of the present invention have an excellent thermal stability and an intrinsic viscosity in tetrahydrofuran (THF) at 30° C. ranging from 0.01 to 7 dl/g, preferably from 0.2 to 2 dl/g.

These compounds are capable of absorbing solar radiation with a certain energy and emitting luminescent radiations with a lower energy (higher wave-length), or even at a higher energy (lower wave-length), depending on the chromophore bonded to the cycloimide in the polymer backbone. The polymers or copolymers of the present invention can therefore be advantageously used for the preparation of spectrum converters of the down-converter type or of the up-converter type, which in turn can be used for improving the performances of solar devices. Spectrum converters of the down-converter type are preferred.

A second object of the present invention relates to polymers and/or copolymers of acrylic monomers comprising cycloimide units functionalised with at least one luminescent chromophore group, preferably photoluminescent. Preferably, the functionalised imidized polymers and/or copolymers comprise in the main chain, the cycloimide unit having the general formula (Ia)

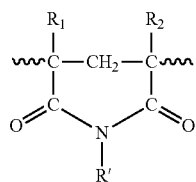

(Ia)

wherein $R_1$ and $R_2$ are H or hydrocarbon groups, preferably aliphatic, having from 1 to 8 carbon atoms, and more preferably are both methyl, and R' is a luminescent, preferably photoluminescent, chromophore group selected among the classes of the conjugated or polycondensed aromatic cyclic hydrocarbons having more than 14, preferably from 16 to 24, carbon atoms in the conjugated or aromatic skeleton, and the compounds containing aromatic heterocycles having at least 5, preferably from 6 to 20, carbon atoms, wherein the imide N atom is bonded to a carbon atom in the aromatic or heterocyclic skeleton.

Preferred according to the present invention are the polymers and copolymers wherein the chromophore group R' is selected from among substituted or unsubstituted pyrene, perylene, p-terphenyl, 1,6-diphenylhexatriene of formula

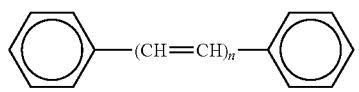

with n=1-3, quinoline, phenanthroline, coumarin. According to another embodiment of the present invention, preferred polymers and copolymers for use in the fabrication of spectrum converters are those comprising from 0.10 to 99.99% in moles of monomeric units of an alkyl acrylate or alkyl methacrylate, from 69.99 to 0% of a vinyl aromatic monomer, from 0.10 to 10.0% in moles of cycloimide units functionalised with at least one luminescent chromophore group having the general formula (Ic):

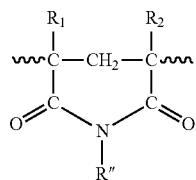

(Ic)

wherein $R_1$ and $R_2$ are H or hydrocarbon groups, preferably aliphatic, having from 1 to 8 carbon atoms and R" is a luminescent chromophore group, and from 1 to 90%, in moles of cycloimide units having the structure of general formula (Id),

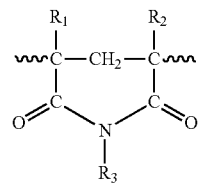

(Id)

wherein groups $R_1$ and $R_2$ have the previously indicated meaning and group $R_3$ is H or an aliphatic or aromatic hydrocarbon group having from 1 to 10 carbon atoms; the above-mentioned percentages in moles referring to the total moles of monomeric units of functionalised polymer or copolymer.

Even more preferably, in the polymers and copolymers of the above type, the total concentration of the chromophore groups R" inside the polymer or copolymer varies from 0.10 to 5%, preferably from 0.10 to 3%, in moles in relation to the total moles of monomeric units of functionalised polymer or copolymer.

Said chromophore group R" is most preferably selected from among the classes of the conjugated or polycondensed aromatic cyclic hydrocarbons, preferably having from 6 to 24 carbon atoms in the conjugated or aromatic skeleton, and the compounds containing aromatic heterocycles having at least 5, preferably from 6 to 20, carbon atoms.

Spectrum converters are devices known in the art and produced industrially, usually associated with one or more photovoltaic cells or another optical device, which normally comprise plates or prisms containing photoluminescent chromophore groups of the type previously described. The polymers and copolymers of the present invention can be obtained in stratified form, for example plates, or in the form of prisms or lenses, and be used in the production of said converters.

A further object of the present invention relates to a solar device containing a spectrum converter comprising one or more functionalised imidized polymers and/or copolymers described above. A solar device according to the present invention typically comprises one or more photovoltaic cells arranged on the edges of a plate produced with the imidized polymer or copolymer according to the present claim 1.

A further object of the present invention relates to a process for the preparation of the above photoactive polymers and copolymers of acrylic monomers comprising cycloimide units functionalised with at least one chromophore group, said process comprising the imidization reaction of a polymer or copolymer of acrylic monomers with an amine and/or amide N-substituted with at least one luminescent chromophore group with the formation, in the main chain of said polymer or copolymer, of cycloimide units N-functionalised with said luminescent chromophore group. Said imidization reaction is preferably carried out at a temperature higher than the melting point of the polymer or copolymer.

In the process according to the invention, the chromophore groups can be accordingly introduced onto the polymer chain through an imidization reaction effected on the polymer or copolymer after its synthesis. This means that a synthesis post-reaction modification of the starting polymer or copolymer is effected, using reagents having amine or amide groups N-substituted with chromophore groups.

Polymers and copolymers which are suitable for this modification reaction are in particular polymers and copolymers of monomeric compounds, such as acrylic and methacrylic acid, and those of acrylic monomers having formula (II), in particular, polymers and copolymers of methyl acrylate, methyl methacrylate and butyl methacrylate, or copolymers of said monomers with the vinyl aromatic monomers of formula (III), especially styrene, of both the statistical and block type.

Particularly preferred, among the polymers and copolymers of the present invention, are polymers and copolymers formed by alkyl acrylates or alkyl methacrylates having formula (II) comprising from 30 to 100% in moles of monomeric units of an alkyl acrylate or alkyl methacrylate, from 70 to 0% of a vinyl aromatic monomer having formula (III). Examples of vinyl aromatic monomers having the above general formula are: styrene; methylstyrene; mono-, di-, tri-, tetra- and penta-chlorostyrene; the corresponding α-methylstyrenes.

For the imidization reaction, known reagents can be adopted, which are typically used for this type of reaction in the state of the art. It is possible, for example, to use the reagents described in IT1201137, IT1224419 or IT1227704 suitably modified so as to have at least one amine or amide group N-substituted with a chromophore species.

Preferred reagents for the purposes of the present invention are compounds containing the chromophore groups listed in Table 1. Particularly preferred are the reagents listed in Table 2, in particular 6-amino-3,4-benzocoumarin, 3-aminocoumarin and 1-aminopyrene, which are bound to the polymer chain forming cyclic imides on the polymer chain, said imides being N-substituted with a chromophore group.

In order to increase the stability of the imidized polymers and copolymers thus obtained, the process according to the present invention can comprise a further imidization of the polymer or copolymer functionalised with chromophore groups.

The imidization is obtained by reaction of the polymer or copolymer with reactants having amine or amide groups N-substituted with H, alkyl groups or phenyl groups. This second reaction is carried out under the same temperature and pressure conditions as the functionalisation reaction of the copolymer with the reagents having chromophore groups. The reaction can be optionally carried out contemporaneously with the functionalisation with the chromophore group, by reacting a mixture of the two amines in the desired proportions.

It is also possible in this reaction to use imidization reagents known in the art, suitably N-substituted with hydrogen, alkyl or phenyl groups. Among the reagent compounds which can be used, benzanilide, formanilide, urea, dimethylurea, diphenylurea or acetamidophenol are particularly preferred.

The above imidization reactions can be carried out in extruders, mixers or in similar equipment suitably equipped with degassing devices, starting from the polymer or copolymer in the molten state or starting from the polymer or copolymer dissolved in a suitable high-boiling polar solvent, such as, for example, dimethylformamide (DMF) or dimethylacetamide (DMA).

According to certain known methods, it is optionally possible to effect the imidization in the presence of an acid catalyst, which allows the reaction to be carried out at lower temperatures and favours the use of less high-boiling solvents. Catalysts suitable for the purpose are, for example, ammonium chloride, ammonium tetrafluoroborate, zinc chloride, zinc acetate, hydrochloric acid, p-toluenesulfonic acid, aluminum chloride.

The imidization reaction of the process according to the present invention is preferably carried out maintaining the polymer or copolymer in the molten state. The reaction temperature typically varies from 150° C. to 350° C., preferably from 190 to 280° C., whereas the reaction pressure preferably varies from 1 kPa to 1 MPa, more preferably from 10 to 500 kPa.

The process according to the present invention has various advantages with respect to the preparation processes of the polymer-based spectrum converters known in the state of the art. In particular, it allows chromophore groups to be stably introduced into a polymeric matrix, guaranteeing their homogeneous distribution on the polymer and at the same time avoiding segregation phenomena.

Furthermore, as the process according to the invention is based on an imidization post-reaction, preferably in the molten state, with amines or amides N-substituted with chromophore groups, it avoids the complicated synthesis of monomers functionalised with chromophore groups to be subsequently subjected to copolymerization with other monomers not having these groups.

Finally, with the process according to the invention, it is possible to prepare thermally stable polymers or copolymers, by following the first imidization (with reactants functionalised with chromophore groups) with a second imidization with reactants comprising amines or amides N-substituted with hydrogen, alkyls and/or phenyls.

The following embodiment examples are provided for purely illustrative purposes of the present invention and should not be considered as limiting its protection scope.

Characterization Method of the Copolymers

The polymers according to the present invention were characterized by means of UV-Vis-NIR spectroscopy, IR spectroscopy, photoluminescence spectroscopy, thermogravimetric analysis (TGA) and through the determination of the following parameters: inherent viscosity (in THF), glass transition temperature ($T_g$), Stability limit temperature (SLT) and functionalisation percentage of the polymer or copolymer with the chromophore groups.

The $T_g$ was determined using a differential calorimeter. The $T_g$ is the temperature corresponding to the flexpoint which appears in the thermogram when the thermal capacity of the sample varies brusquely; the temperature increase rate was 20° C./minute and the measurement was effected after a first heating to 200° C. and subsequent cooling.

The TGA analysis was effected by gradually increasing the temperature from 50° to 300° C. (with a thermal rate of 20° C./minute) under nitrogen and continuously registering the weight variation of the sample.

The Stability limit temperature (SLT) expressed in ° C., was determined as the temperature corresponding to a TGA weight loss of 5%.

Example 1

20 g of a copolymer containing 98% by weight of methyl methacrylate and 2% by weight of methyl acrylate, having a glass transition temperature (Tg) equal to 118.0° C., a TGA equal to 3.0%, a SLT equal to 315° C. and an inherent viscosity equal to 0.34 dl/g (in THF a 30° C.) and 100.0 mg (0.5 mmol) of 6-amino-3,4-benzocoumarin were charged, in a nitrogen atmosphere, into a glass reactor equipped with a stirrer and vent for the volatile components. The mixture was heated gradually to its melting point and subsequently to 200° C. The reaction was continued at this temperature for 3 hours and then cooled under nitrogen; the raw reaction product was diluted with 50 ml of dichloromethane, obtaining a solution from which the polymer was recovered by coagulation with methanol. The copolymer thus imidized was filtered and dried under vacuum at 60° C. The IR spectrum was registered with a FT-IR Nicolet Nexus spectrometer within a spectral range of 4,000-400 cm$^{-1}$ (64 scans, resolution equal to 2 cm$^{-1}$). In the IR spectrum, the presence of absorption bands with a wave-length corresponding to 1777, 1640 and 1323 cm$^{-1}$ confirmed the complete functionalisation of the copolymer.

By comparison with a suitably prepared calibration curve, the absorptions at 350 nm and 2904 nm observed in the UV-Vis-NIR spectrum, allowed a functionalisation percentage equal to about 0.2% mol. to be determined. The UV-Vis-NIR spectra were registered within a spectral range of 190-3200 nm with a Perkin Elmer λ19 instrument (double beam and double monochromator spectrophotometer, scan rate of 120 nm/min and step of 1 nm).

The photoluminescence spectrum of a film of functionalised copolymer having a thickness equal to 250 microns was acquired by exciting the sample with a radiation of 385 nm. The spectrum was registered with a Spex Fluorolog 2 spectrofluorimeter having a 450 W Xe source, equipped with a double monochromator in excitation and emission, operating with all the openings corresponding to 1.0 nm of bandwidth. The functionalised copolymer shows an intense fluorescence band centred at 480 nm, this manifestation being completely absent in the spectrum of the film of non-functionalised copolymer acquired under identical conditions. This confirms the down-conversion photoactive properties conferred to the copolymer by functionalisation with 6-amino-3,4-benzocoumarin.

Example 2

An imidized copolymer functionalised with chromophore groups was obtained according to the same procedure as Example 1, using 80.7 mg (0.5 mmoles) of 3-aminocoumarin in substitution of 6-amino-3,4-benzocoumarin.

Example 3

An imidized copolymer functionalised with chromophore groups was obtained according to the same procedure as Example 1, using 108.5 mg (0.5 mmoles) of 1-aminopyrene in substitution of 6-amino-3,4-benzocoumarin.

Example 4

20 g of a copolymer containing 56% by weight of styrene and 44% by weight of methyl methacrylate, having a glass transition temperature (Tg) equal to 102.8° C., a TGA equal to 0.38%, a SLT equal to 375° C. and an inherent viscosity equal to 0.52 dl/g (in THF a 30° C.) and 92.8 mg (0.4 mmol) of 6-amino-3,4-benzocoumarin were charged, in a nitrogen atmosphere, into a glass reactor equipped with a stirrer and vent for the volatile components. The mixture was heated gradually to its melting point and subsequently to 200° C. The reaction was continued at this temperature for 3 hours and then cooled under nitrogen; the raw reaction product was diluted with 50 ml of THF, obtaining a solution from which the polymer was recovered by coagulation with methanol. The copolymer thus imidized was filtered and dried under vacuum at 100° C.

Example 5

An imidized copolymer functionalised with chromophore groups was obtained according to the same procedure as Example 4, using 64.5 mg (0.4 mmoles) of 3-aminocoumarin in substitution of 6-amino-3,4-benzocoumarin.

Example 6

An imidized copolymer functionalised with chromophore groups was obtained according to the same procedure as Example 4, using 87.0 mg (0.4 mmoles) of 1-aminopyrene in substitution of 6-amino-3,4-benzocoumarin.

Example 7

20 g of a copolymer containing 40% by weight of styrene and 60% by weight of methyl methacrylate, having a glass transition temperature (Tg) equal to 105.7° C., a TGA equal to 0.36%, a SLT equal to 365° C. and an inherent viscosity equal to 0.61 dl/g (in THF a 30° C.), and 126.6 mg (0.6 mmol) of 6-amino-3,4-benzocoumarin were charged, in a nitrogen atmosphere, into a glass reactor equipped with a stirrer and vent for the volatile components. The mixture was heated gradually to its melting point and subsequently to 200° C. The reaction was continued at this temperature for 3 hours and then cooled under nitrogen; the raw reaction product was diluted with 50 ml of THF, obtaining a solution from which the polymer was recovered by coagulation with methanol. The copolymer thus imidized was filtered and dried under vacuum at 100° C.

Example 8

An imidized copolymer functionalised with chromophore groups was obtained according to the same procedure as Example 7, using 96.7 mg (0.6 mmoles) of 3-aminocoumarin in substitution of 6-amino-3,4-benzocoumarin.

Example 9

An imidized copolymer functionalised with chromophore groups was obtained according to the same procedure as Example 7, using 130.4 mg (0.6 mmoles) of 1-aminopyrene in substitution of 6-amino-3,4-benzocoumarin.

Example 10

20 g of a copolymer containing 98% by weight of methyl methacrylate and 2% by weight of methyl acrylate, having a glass transition temperature (Tg) equal to 118.0° C., a TGA equal to 3.0%, a SLT equal to 315° C. and an inherent viscosity equal to 0.34 dl/g (in THF a 30° C.) and 100.0 mg (0.5 mmol) of 6-amino-3,4-benzocoumarin were charged, in a nitrogen atmosphere, into a glass reactor equipped with a stirrer and vent for the volatile components. The mixture was heated gradually to its melting point and subsequently to 200° C. After 3 hours of reaction under these conditions 12 g (0.1 moles) of benzamide were added, in a nitrogen atmosphere, and the temperature was brought to 235° C. The reaction was continued for a further 3 hours and the mixture was then cooled under nitrogen; the raw reaction product was diluted with 50 ml of dichloromethane, obtaining a solution from which the polymer was recovered by coagulation with methanol. The copolymer thus imidized was filtered and dried under vacuum at 100° C.

The copolymer has a Tg equal to 154° C. and a TGA equal to 0.2%.

Example 11

An imidized copolymer functionalised with chromophore groups was obtained according to the same procedure as Example 10, using 12 g (0.1 moles) of formanilide in substitution of benzamide.

The copolymer has a Tg equal to 170° C. and a TGA equal to 0.8%.

Example 12

20 g of a copolymer containing 56% by weight of styrene and 44% by weight of methyl methacrylate, having a glass transition temperature (Tg) equal to 102.8° C., a TGA equal to 0.38%, a SLT equal to 375° C. and an inherent viscosity equal to 0.52 dl/g (in THF a 30° C.), and 92.8 mg (0.4 mmol) of 6-amino-3,4-benzocoumarin were charged, in a nitrogen atmosphere, into a glass reactor equipped with a stirrer and vent for the volatile components. The mixture was heated gradually to its melting point and subsequently to 200° C. After 3 hours of reaction under these conditions 5.3 g (0.04 moles) of benzamide were added, in a nitrogen atmosphere, and the temperature was brought to 235° C. The reaction was continued for a further 3 hours and the mixture was then cooled under nitrogen; the raw reaction product was diluted with 50 ml of THF, obtaining a solution from which the polymer was recovered by coagulation with methanol. The copolymer thus imidized was filtered and dried under vacuum at 100° C.

The copolymer has a Tg equal to 113° C., a TGA equal to 1.0%, a SLT equal to 395° C. and an inherent viscosity of 0.48 dl/g.

Example 13

An imidized copolymer functionalised with chromophore groups was obtained according to the same procedure as Example 12, using 3.5 g (0.04 moles) of 1,3-dimethylurea in substitution of benzamide.

The copolymer has a Tg equal to 115° C., a TGA equal to 0.82%, a SLT equal to 400° C. and an inherent viscosity of 0.48 dl/g.

Example 14

An imidized copolymer functionalised with chromophore groups was obtained according to the same procedure as Example 12, using 8.5 g (0.04 moles) of 1,3-diphenylurea in substitution of benzamide.

The copolymer has a Tg equal to 122° C., a TGA equal to 0.28%, a SLT equal to 400° C. and an inherent viscosity of 0.49 dl/g.

Example 15

20 g of a copolymer containing 40% by weight of styrene and 60% by weight of methyl methacrylate, having a glass transition temperature (Tg) equal to 105.7° C., a TGA equal to 0.36%, a SLT equal to 365° C. and an inherent viscosity equal to 0.61 dl/g (in THF a 30° C.), and 126.6 mg (0.6 mmol) of 6-amino-3,4-benzocoumarin were charged, in a nitrogen atmosphere, into a glass reactor equipped with a stirrer and vent for the volatile components. The mixture was heated gradually to its melting point and subsequently to 200° C. After 3 hours of reaction under these conditions 7.3 g (0.06 moles) of benzamide were added, in a nitrogen atmosphere, and the temperature was brought to 235° C. The reaction was continued for a further 3 hours and the mixture was then cooled under nitrogen; the raw reaction product was diluted with 50 ml of THF, obtaining a solution from which the polymer was recovered by coagulation with methanol. The copolymer thus imidized was filtered and dried under vacuum at 100° C.

The copolymer has a Tg equal to 131.4° C., a TGA equal to 1.19%, a SLT equal to 400° C. and an inherent viscosity of 0.48 dl/g.

Example 16

An imidized copolymer functionalised with chromophore groups was obtained according to the same procedure as Example 15, using 5.2 g (0.06 moles) of 1,3-dimethylurea in substitution of benzamide.

The copolymer has a Tg equal to 117° C., a TGA equal to 1.820, a SLT equal to 400° C. and an inherent viscosity of 0.48 dl/g.

Example 17

An imidized copolymer functionalised with chromophore groups was obtained according to the same procedure as Example 15, using 12.7 g (0.06 moles) of 1,3-diphenylurea in substitution of benzamide.

The copolymer has a Tg equal to 124° C., a TGA equal to 0.28%, a SLT equal to 400° C. and an inherent viscosity of 0.49 dl/g.

The invention claimed is:

1. A device comprising a spectrum converter and at least one photovoltaic cell, wherein said spectrum converter comprises one or more photo-active polymers or copolymers of at least one acrylic monomer comprising cycloimide units functionalized with at least one luminescent chromophore group wherein said at least one luminescent chromophore group has a difference between $\lambda_{max}^{ex}$ and $\lambda_{max}^{em}$ of at least 50 nm, where $\lambda_{max}^{ex}$ is a peak wavelength of excitation band (absorption) of said chromophore group, and $\lambda_{max}^{em}$ is a peak wavelength of emission band of said chromophore group.

2. The device of claim 1, wherein said photoactive polymer or copolymer of at least one acrylic monomer, consists of from 0.10 to 99.99% in moles of at least one monomeric unit of an alkyl acrylate or alkyl methacrylate, from 69.99 to 0% of a vinyl aromatic monomer, from 0.01 to 10.0% in moles of at least one cycloimide unit in a main chain of the polymer or copolymer, functionalized with at least one luminescent chromophore group of formula (Ia)

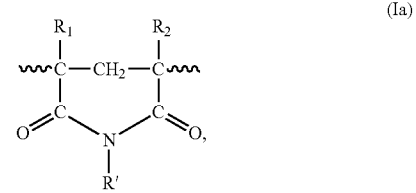

wherein $R_1$ and $R_2$ are H or a hydrocarbon group having from 1 to 8 carbon atoms, and R' is a luminescent chromophore group selected from the group consisting of a conjugated aromatic cyclic hydrocarbon having more than 14 carbon atoms in the conjugated skeleton, a polycondensed aromatic cyclic hydrocarbon having more than 14 carbon atoms in the aromatic skeleton, and a compound comprising at least one aromatic heterocycle having at least 5 carbon atoms, and wherein the imide N atom is bonded to a carbon atom in the aromatic or heterocyclic skeleton, and from 0 to 99.89% in moles of at least one cycloimide unit of formula (Ib),

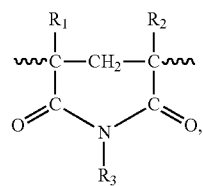

(Ib)

wherein groups $R_1$ and $R_2$ have the previously indicated meaning and the group $R_3$ is H or an aliphatic or aromatic hydrocarbon group having from 1 to 10 carbon atoms, and wherein above-mentioned percentages in moles refer to total moles of monomeric units of functionalized polymer or copolymer.

3. The device of claim 1, wherein a total concentration of the chromophore groups inside the polymer or copolymer varies from 0.1 to 3%, in moles in relation to total moles of monomeric units of functionalized polymer or copolymer.

4. The device of claim 1, wherein the acrylic monomer is at least one selected from the group consisting of methyl acrylate, methyl methacrylate, and butyl methacrylate.

5. The device of claim 1, wherein the at least one cycloimide unit functionalized with at least one luminescent chromophore group have formula (I)

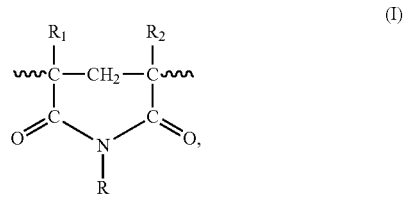

(I)

wherein $R_1$ and $R_2$ are H or a hydrocarbon group having from 1 to 8 carbon atoms, and R is a luminescent chromophore group.

6. The device of claim 5, wherein the chromophore group R is selected from the group consisting of a conjugated aromatic cyclic hydrocarbon, a polycondensed aromatic cyclic hydrocarbon, and a compound comprising at least one aromatic heterocycle having at least 5 carbon atoms, wherein the imide N atom is bonded to a carbon atom in the aromatic or heterocyclic skeleton.

7. The device of claim 1, wherein at least one of the luminescent chromophore groups is photoluminescent.

8. The device of claim 5, wherein $R_1$ and $R_2$ are aliphatic hydrocarbon groups.

9. The device of claim 5, wherein $R_1$ and $R_2$ are both methyl.

10. The device of claim 1, wherein said spectrum converter obtained is in a stratified form or in the form of prisms or lenses.

* * * * *